(12) United States Patent
Fushie et al.

(10) Patent No.: US 9,245,814 B2
(45) Date of Patent: Jan. 26, 2016

(54) SUBSTRATE ASSEMBLY, METHOD OF MANUFACTURING SUBSTRATE ASSEMBLY AND METHOD OF MANUFACTURING CHIP PACKAGE

(71) Applicant: HOYA CORPORATION, Shinjuku-ku, Tokyo (JP)

(72) Inventors: Takashi Fushie, Shinjuku-ku (JP); Kunihiko Ueno, Shinjuku-ku (JP); Hajime Kikuchi, Shinjuku-ku (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 14/209,419

(22) Filed: Mar. 13, 2014

(65) Prior Publication Data

US 2014/0301050 A1    Oct. 9, 2014

(30) Foreign Application Priority Data

Apr. 5, 2013 (JP) ................. 2013-079773

(51) Int. Cl.
| | |
|---|---|
| *H01L 21/48* | (2006.01) |
| *H01L 23/15* | (2006.01) |
| *G03F 7/00* | (2006.01) |
| *H01L 23/498* | (2006.01) |
| *H01L 21/56* | (2006.01) |

(52) U.S. Cl.
CPC ........ *H01L 23/15* (2013.01); *G03F 7/00* (2013.01); *H01L 21/568* (2013.01); *H01L 21/4871* (2013.01); *H01L 21/561* (2013.01); *H01L 23/49833* (2013.01); *H01L 2924/0002* (2013.01); *Y10T 428/24942* (2015.01)

(58) Field of Classification Search
CPC ............... H05K 1/0306; H05K 1/0271; H01L 21/02112; H01L 21/2007; H01L 21/568; H01L 21/76251; H01L 23/15; H01L 23/49833; H01L 24/18; H01L 24/73; H01L 24/93; H01L 24/94; H01L 24/97; H01L 2224/03001; H01L 2224/02319; H01L 2224/03; H01L 2224/20; H01L 2224/94; H01L 2224/97
See application file for complete search history.

(56) References Cited

U.S. PATENT DOCUMENTS

| | | | |
|---|---|---|---|
| 2006/0151870 A1* | 7/2006 | Nishiyama et al. | 257/700 |
| 2010/0232127 A1* | 9/2010 | Mori et al. | 361/783 |

FOREIGN PATENT DOCUMENTS

| | | |
|---|---|---|
| JP | 2004-214501 A | 7/2004 |
| JP | 2004-319656 A | 11/2004 |
| WO | 2008/105496 A1 | 9/2008 |

* cited by examiner

*Primary Examiner* — Armando Rodriguez
(74) *Attorney, Agent, or Firm* — Sughrue Mion, PLLC (57) ABSTRACT

A substrate assembly including a photosensitive etching glass substrate; and a first substrate and a second substrate for interposing both main surfaces of the photosensitive etching glass substrate between them. One of the main surfaces of the photosensitive etching glass substrate is thermally bonded to the first substrate, and the other main surface of the photosensitive etching glass substrate is bonded to the second substrate. When a thermal expansion coefficient of the photosensitive etching glass substrate is defined as C0, and a thermal expansion coefficient of the first substrate is defined as C1, and a thermal expansion coefficient of the second substrate is defined as C2, C1/C2 satisfies a relation of 0.7 or more and 1.3 or less, and at least one of a relation of C0/C1 satisfying less than 0.7 or larger than 1.3, and a relation of C0/C2 satisfying less than 0.7 or larger than 1.3 is satisfied.

10 Claims, 6 Drawing Sheets

SUBSTRATE ASSEMBLY, METHOD OF MANUFACTURING SUBSTRATE ASSEMBLY AND METHOD OF MANUFACTURING CHIP PACKAGE

BACKGROUND

1. Technical Field

The present invention relates to a substrate assembly, a method of manufacturing a substrate assembly and a method of manufacturing a chip package.

2. Description of Related Art

A photosensitive etching glass is the glass wherein only an exposed area is crystallized by exposing the glass containing a photosensitive component and photosensitization component. In the crystallized area, a dissolution speed for dissolving into acid is largely different, compared with a non-crystallized area. Accordingly, by utilizing such a nature, selective etching can be applied to the photosensitive etching glass. As a result, fine processing can be applied to the photosensitive etching glass without using mechanical processing.

Further, the photosensitive etching glass has a characteristic of a glass such that mechanical characteristics such as heat-resistance, smoothness, and rigidity, etc., are excellent, compared with a resin material. Accordingly, the photosensitive etching glass is suitably used for a substrate, etc., packaged in electronic equipment.

In recent years, higher density of an electronic circuit packaged in the equipment, is required with a progress of miniaturization of the electric equipment. In order to response to such a request, a packaging area is reduced by using an interposer interposed between a chip element such as a semiconductor element and a wiring board for electrically connecting them. When the photosensitive etching glass is utilized as the interposer, a through hole is formed on the photosensitive etching glass, and the through hole is filled with a conductive substance (for example, see patent document 1).

Further, as another method for responding to the miniaturization of the electronic equipment, a wafer level package is performed, which is configured to form external terminals, etc., in each chip element to obtain a chip package, in a stage of a wafer in which a plurality of chip elements are formed (for example, see patent documents 2 and 3). After the wafer level package is performed, the package is divided into chip element units, and each of them is packaged in the wiring board, etc. In the wafer level package, the substrate such as an interposer, etc., is bonded to the wafer, and this structure is divided individually in some cases.

Patent Document 1
International Publication No. 2008/105496
Patent Document 2
Japanese Patent Laid Open Publication No. 2004-214501
Patent Document 3
Japanese Patent Laid Open Publication No. 2004-319656

When the wafer and the substrate are bonded to each other, it is necessary to bond them while securing an electric connection between the wafer and the substrate. For example, the wafer and the substrate are thermally bonded to each other, with solder and ACF (Anisotropic Conductive Film), etc., interposed between them.

Such a thermal bond is carried out at a higher temperature (for example about 150 to 300° C.) than a room temperature. Accordingly, when a thermal expansion coefficient of the wafer and a thermal expansion coefficient of the substrate are largely different from each other, there is a problem that thermally bonded wafer and substrate are warped due to a stress caused by a difference of the thermal expansion coefficients when the temperature is decreased to the room temperature after thermal bond. Particularly, when a thickness of the wafer or the substrate is decreased to achieve a higher density and lower height of the substrate, warp of the wafer or the substrate occurs remarkably.

Figure 6:
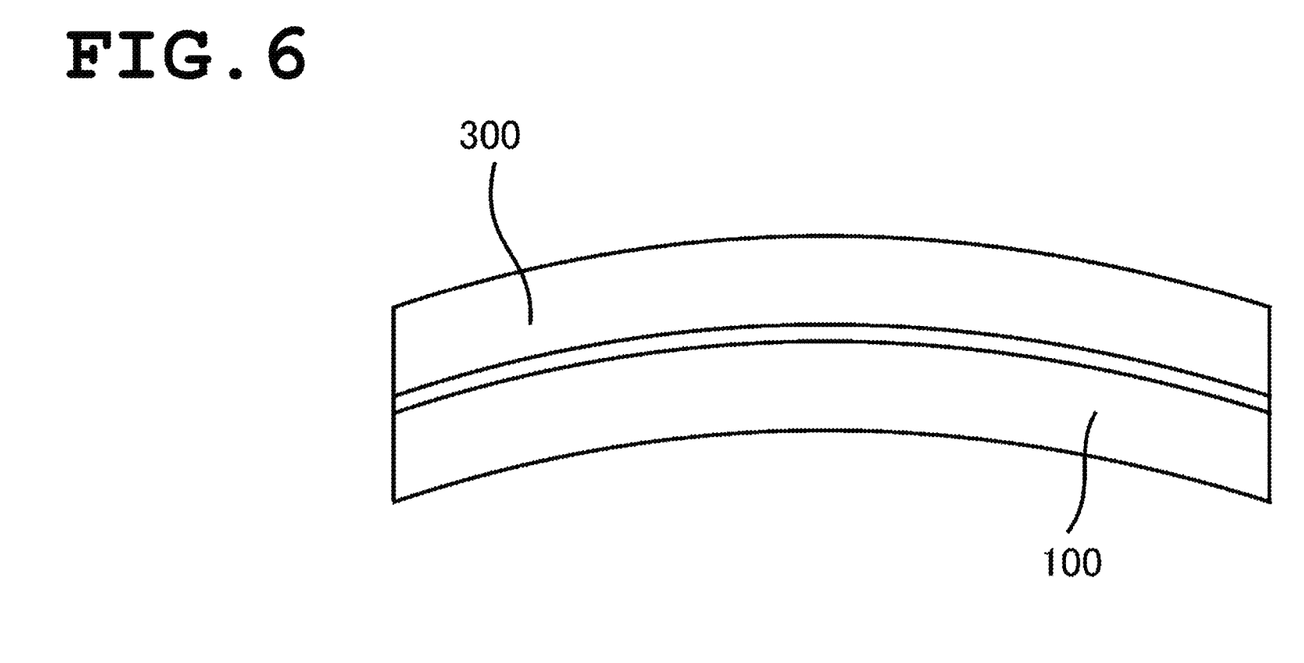
FIG. 6 is a schematic sectional view of a substrate assembly according to a conventional example.

Further, the wafer and the substrate are thermally bonded to each other in some cases by using a handling substrate before the thermal bond, for assisting a thin substrate, with the handling substrate and the substrate bonded to each other. However, in this case as well, if the thermal expansion coefficient of the handling substrate and the thermal expansion coefficient of the substrate are largely different from each other, as shown in FIG. 6, a handling substrate 100 and a substrate 300 are warped or peeled-off before cooling, thus making it difficult to perform the thermal bond between the wafer and the substrate.

In order to solve such a problem, it can be considered that the thermal expansion coefficient of the wafer or the handling substrate and the thermal expansion coefficient of the substrate are set to about the same values. However, in this case, selection of materials is limited. For example, the thermal expansion coefficient of the photosensitive etching glass is about 10 ppm/° C., and the thermal expansion coefficient of a Si wafer is about 2.6 ppm/° C., thus involving a problem that the photosensitive etching glass having a suitable characteristic as a substrate cannot be used for the above purpose of use.

Therefore, an object of the present invention is to provide a substrate assembly not allowing the warp to occur and a method of manufacturing the same, even when the substrate assembly is formed by combining substrates having largely different thermal expansion coefficients. Further, an object of the present invention is to provide a method of manufacturing a chip package in an individually divided state divided from the substrate assembly obtained by the wafer level package.

In order to achieve the above-described object, the warp of the substrate assembly is a result of a stress caused by the difference of the thermal expansion coefficients which appears as the warp, wherein the stress is inevitably generated by a temperature variation, and therefore inventors of the present invention considers it difficult to have a structure not allowing the stress to occur. Then, it is found that the warp can be suppressed by not allowing the stress to occur, but employing a structure for preventing the generated stress from appearing as the warp.

Specifically, when the substrate assembly is fabricated by combining the substrates having largely different thermal expansion coefficients, a substrate having almost the same thermal expansion coefficient as the thermal expansion coefficient of one of the substrates, is prepared. It is also found that the substrate having a large thermal expansion coefficient (or small thermal expansion coefficient) is interposed by two substrates having a small thermal expansion coefficient (or large thermal expansion coefficient), and the stress is remained inside of the substrate assembly without allowing the stress to appear as the warp due to the difference of the thermal expansion coefficients. The present invention is thus completed.

SUMMARY OF THE INVENTION

According to an aspect of the present invention, there is provided a substrate assembly, including:

a photosensitive etching glass substrate; and a first substrate and a second substrate for interposing both main surfaces of the photosensitive etching glass substrate between them, wherein one of the main surfaces of the photosensitive etching glass substrate is thermally bonded to the first substrate, and the other main surface of the photosensitive etching glass substrate is bonded to the second substrate, and when a thermal expansion coefficient of the photosensitive etching glass substrate is defined as C0, and a thermal expansion coefficient of the first substrate is defined as C1, and a thermal expansion coefficient of the second substrate is defined as C2, C1/C2 satisfies a relation of 0.7 or more and 1.3 or less, and at least one of a relation of C0/C1 satisfying less than 0.7 or larger than 1.3, and a relation of C0/C2 satisfying less than 0.7 or larger than 1.3 is satisfied.

According to another aspect of the present invention, there is provided a method of manufacturing a substrate assembly having a photosensitive etching glass substrate, and a first substrate and a second substrate for interposing both main surfaces of the photosensitive etching glass substrate between them, including:

bonding the photosensitive etching glass substrate and the second substrate; and thermally bonding the photosensitive etching glass substrate bonded to the second substrate, and the first substrate at a thermal bonding temperature;

wherein when a thermal expansion coefficient of the photosensitive etching glass substrate is defined as C0, and a thermal expansion coefficient of the first substrate is defined as C1, and a thermal expansion coefficient of the second substrate is defined as C2, C1/C2 satisfies a relation of 0.7 or more and 1.3 or less, and at least one of a relation of C0/C1 satisfying less than 0.7 or larger than 1.3, and a relation of C0/C2 satisfying less than 0.7 or larger than 1.3 is satisfied.

According to another aspect of the present invention, there is provided a method of manufacturing a chip package, including:

dicing and individually dividing a substrate assembly, wherein the substrate assembly is manufactured by the above method of manufacturing a substrate assembly, having a through hole formed on the photosensitive etching glass substrate, the through hole filled with a conductive substance, the photosensitive etching glass constituting an interposer, wherein a plurality of chip elements having a specific wiring pattern are formed on the first substrate so that the interposer and the chip elements are electrically connected to each other; and separating the second substrate from an individually divided substrate assembly after dicing.

According to the present invention, even when the substrate assembly is formed by combining substrates having largely different thermal expansion coefficients, the substrate assembly and the method of manufacturing the same can be provided without generating warp. Further, the method of manufacturing an individually divided chip package from the substrate assembly obtained by a wafer level package can be provided.

DETAILED DESCRIPTION OF THE INVENTION

The present invention will be specifically described in the following order, based on an embodiment shown in the figure.
1. Substrate assembly
2. Method of manufacturing a substrate assembly
3. Method of manufacturing a chip package
4. Effect of this embodiment
5. Modified example, etc.

1. Substrate Assembly

Figure 1:
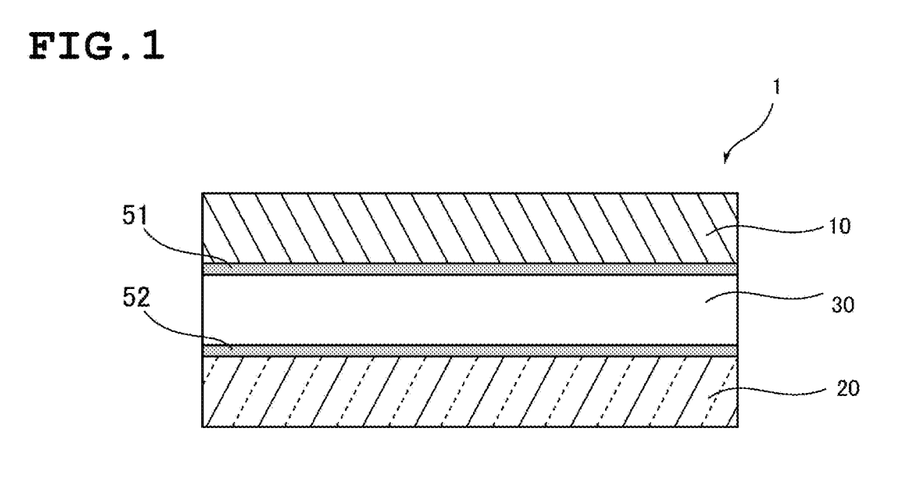
FIG. 1 is a schematic sectional view of a substrate assembly according to this embodiment.

As shown in FIG. 1, a substrate assembly 1 of this embodiment has a structure in which both main surfaces of a photosensitive etching glass substrate 30 are interposed between a first substrate 10 and a second substrate 20. Further, the photosensitive etching glass substrate 30 and the first substrate 10 are bonded to each other, and the photosensitive etching glass substrate 30 and the second substrate 20 are bonded to each other, thus integrally forming the substrate assembly 1.

(First Substrate)

Although a material of the first substrate 10 is not particularly limited, the first substrate 10 is made of Si in this embodiment. Further, chip elements having a specific wiring pattern are formed on the first substrate 10. The chip elements formed on the first substrate 10 are not particularly limited, and for example, semiconductor elements, sensor elements, and filter elements, etc., can be given, and in this embodiment, the semiconductor elements are given. Namely, the first substrate 10 is a Si wafer on which the semiconductor elements are formed. An external terminal, etc., is already formed in the semiconductor element on the Si wafer, as a wafer level package.

(Photosensitive Etching Glass Substrate)

The photosensitive etching glass substrate 30 is constituted of a $SiO_2$—$Li_2O$—$Al_2O_3$-based glass containing Au, Ag, and Cu as photosensitive components, and $CeO_2$ as a sensitizer. In this embodiment, the glass is preferably a crystallized photosensitive etching glass. The crystallized photosensitive etching glass is the glass obtained by crystallizing a non-crystallized area after applying specific processing thereto such as formation of a through hole, etc.

In this embodiment, the through hole is formed on the photosensitive etching glass substrate 30 so as to pass through both main surfaces, corresponding to a wiring pattern formed on the first substrate 10, and the through hole is filled with a conductive substance such as copper, etc. The photosensitive etching glass substrate 30 is electrically connected to the first substrate 10 via the conductive substance, thus forming an interposer.

(Second Substrate)

The second substrate 20 may be the substrate having a specific function, and in this embodiment, the second substrate 20 may be an auxiliary substrate such as a substrate for handling or a substrate for dicing, etc. Explanation is given below for a case that the second substrate 20 is the substrate for dicing.

The substrate assembly 1 of this embodiment is used for manufacturing a chip package. Specifically, the substrate assembly 1 is cut out into each chip element unit by dicing, and an individually divided substrate assembly is obtained. Thereafter, the second substrate 20 is finally separated from the individually divided substrate assembly, and the obtained chip package (chip element attached with interposer) is packaged in a wiring board, etc. Details are described later.

In the substrate assembly 1 of this embodiment, when a thermal expansion coefficient of the photosensitive etching glass substrate 30 is defined as C0, and a thermal expansion coefficient of the first substrate 10 is defined as C1, and a thermal expansion coefficient of the second substrate 20 is defined as C2, C1/C2 satisfies a relation of 0.7 or more and 1.3 or less, and preferably satisfies a relation of 0.8 or more and 1.2 or less. Namely, the first substrate 10 and the second substrate 20 have about the same thermal expansion coefficients.

Further, a relation of a thermal expansion coefficient C0 of the photosensitive etching glass substrate 30 and thermal expansion coefficients (C1, C2) of the first substrate 10 or the second substrate 20 satisfies at least one of a relation of C0/C1 satisfying less than 0.7 or larger than 1.3, and a relation of C0/C2 satisfying less than 0.7 or larger than 1.3. Preferably, at least one of a relation of C0/C1 satisfying 0.6 or less and 1.4 or more, and a relation of C0/C2 satisfying 0.6 or less and 1.4 or more is satisfied. In other words, the photosensitive etching glass substrate 30 and the first substrate 10 or the second substrate 20 has a relation in which the thermal expansion coefficients are relatively largely different from each other.

In the substrate assembly 1 of this embodiment, the photosensitive etching glass substrate 30 and the first substrate 10 are bonded to each other via an adhesive member 51, and the photosensitive etching glass substrate 30 and the second substrate 20 are bonded to each other via an adhesive member 52. In this embodiment, the photosensitive etching glass substrate 30 and at least one of the substrates of the first substrate 10 and the second substrate 20 are thermally bonded to each other.

In this specification, "bonding" means a state that the substrates are integrally fixed to each other. Bonding means is not particularly limited, and may be selected according to the material and function, etc., of the substrate to be bonded. For example, the substrates may be bonded to each other via the adhesive agent, etc., or may be directly bonded to each other. Further, "thermal bonding" means a state that the substrates are bonded to each other in a heated state. Bonding by solder, bonding by thermoplastic resin, bonding by ACF, and dispersion bonding, etc., can be given for example.

Accordingly, the substrate assembly 1 of this embodiment is configured so that the photosensitive etching glass substrate 30 is interposed between the first substrate 10 and the second substrate 20 and a bonding structure is cooled to a room temperature after passing through a high temperature process such as thermal bonding (for example, process at 150 to 300° C.).

If cooling the substrate assembly having the structure in which the photosensitive etching glass substrate 30 and the first substrate 10 are thermally bonded to each other and the photosensitive etching glass substrate 30 and the second substrate 20 are bonded to each other, a stress is generated, which is caused by a difference between the thermal expansion coefficient C0 of the photosensitive etching glass substrate 30 and the thermal expansion coefficient C1 of the first substrate 10, and a stress is generated, which is caused by a difference between the thermal expansion coefficient C0 of the photosensitive etching glass substrate 30 and the thermal expansion coefficient C2 of the second substrate 20.

Figure 2A:
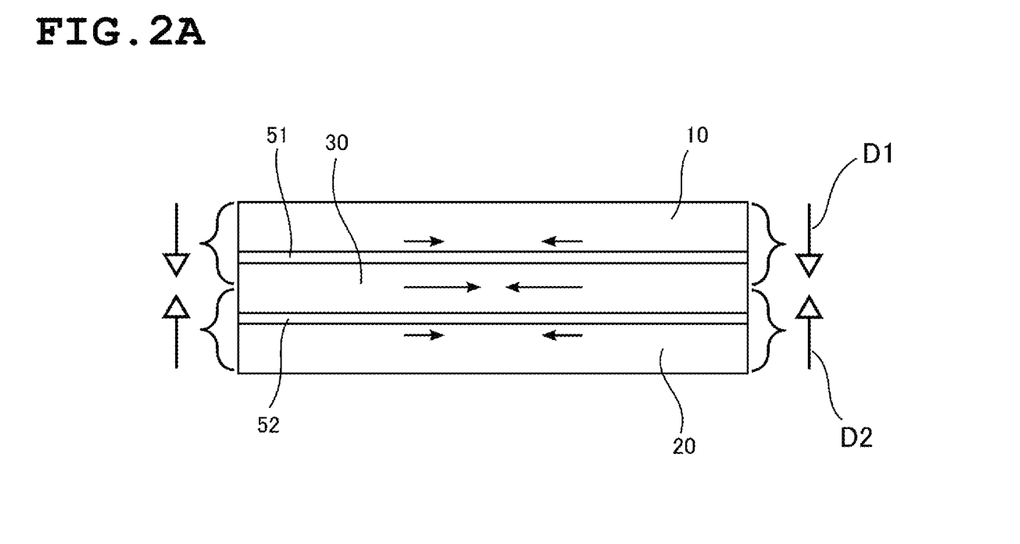
FIG. 2A and FIG. 2B are views showing a direction of a stress generated when cooling the substrate assembly.

As shown in FIG. 2A, owing to the stress generated between the photosensitive etching glass substrate 30 and the first substrate 10, an end portion of the substrate assembly is likely to be deformed (warped) downward (in a direction shown by arrow D1 shown in FIG. 2A), and owing to the stress generated between the photosensitive etching glass substrate 30 and the second substrate 20, the end portion of the substrate assembly is likely to be deformed (warped) upward (in a direction shown by arrow D2 shown in FIG. 2A). Further, C0, C1, and C2 are set so as to satisfy the above-mentioned range, the above end portions of the substrate assembly are deformed in about the same size and are deformed in an opposite direction to each other.

Accordingly, the deformation of the end portion of the substrate assembly is almost canceled, thus not generating the warp in the substrate assembly 1. Namely, the substrate assembly 1 is obtained by being cooled to a desired temperature (for example room temperature) in a state that the stresses are remained in its inside.

Figure 2B:
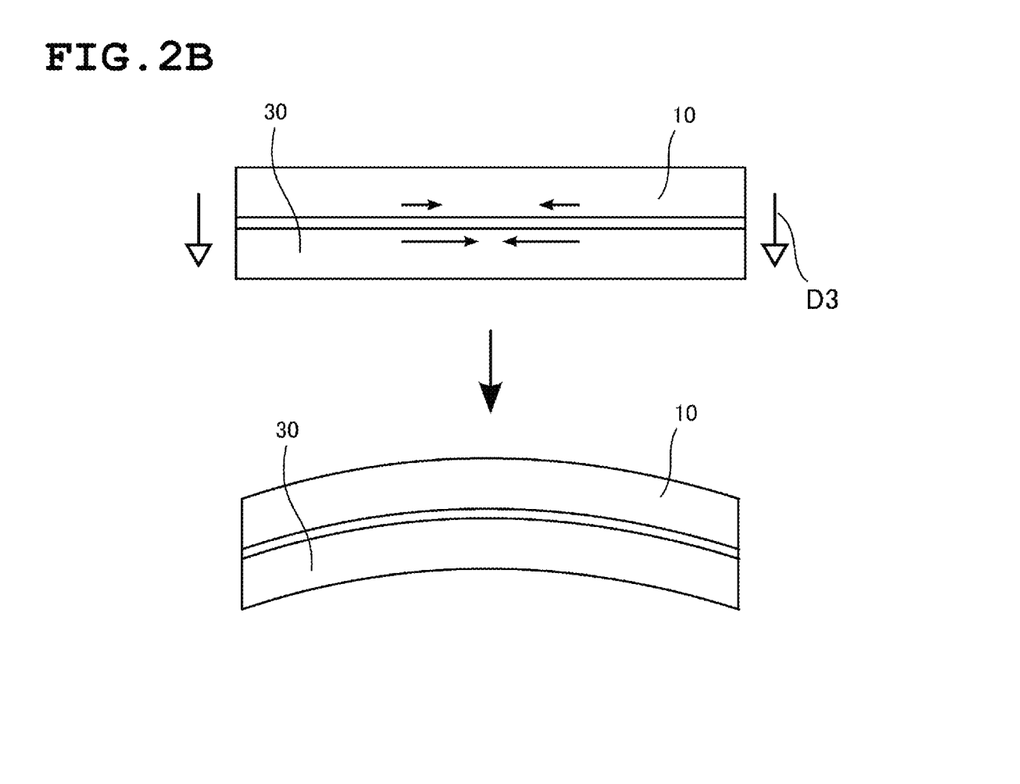

Meanwhile, if the substrate assembly 1 in which the photosensitive etching glass substrate 30 and the first substrate 10 are bonded to each other, or the substrate assembly 1 in which the photosensitive etching glass substrate 30 and the second substrate 20 are bonded to each other, are cooled, as shown in FIG. 2B, the stress is generated inside of the substrate assembly 1, which is caused by the difference of the thermal expansion coefficients, and the warp is generated due to the stress downward when cooling the substrate assembly 1 (in a direction shown by arrow D3 shown in FIG. 2B).

2. Method of Manufacturing a Substrate Assembly 1

A method of manufacturing the substrate assembly 1 according to this embodiment will be described next, using a flowchart shown in FIG. 3 and manufacturing steps shown in FIG. 4A to FIG. 4E. The method of manufacturing a substrate assembly 1 described in (1) will be described hereafter. Namely, explanation is given for the method of manufacturing the substrate assembly 1 in which the interposer is formed by the photosensitive etching glass substrate 30, the first substrate 10 is the Si wafer on which a plurality of semiconductor elements having a specific wiring pattern are formed, and the second substrate 20 is the substrate for dicing of the chip package.

First, the first substrate 10 is prepared. The Si wafer as the first substrate 10 is manufactured by a semiconductor manufacturing process. Specifically, a wiring pattern is baked on a disc-shaped single crystal silicon by lithography, and etching is applied thereto, then ion implantation is performed thereto, and an electrode, etc., is formed. Further, formation of the external terminal and encapsulation of resin, etc., are performed in a stage of the wafer, to thereby obtain the first substrate 10. Although a size of the first substrate 10 is not particularly limited, the first substrate 10 has a disc-shape with a diameter of 100 to 300 mm and a thickness of about 0.2 to 1.0 mm. Further, since the first substrate is made of Si, the thermal expansion coefficient C1 of the first substrate 10 is 2.6 ppm/° C.

Subsequently, the photosensitive etching glass substrate 30 is prepared. The size of the photosensitive etching glass substrate 30 may be selected corresponding to the size of the Si wafer. For example, the photosensitive etching glass substrate 30 has a disc-shape having a diameter of 100 to 300 mm, having a thickness of about 0.1 to 1.0 mm, and preferably about 0.2 to 0.5 mm. Since the warp is easily generated as the thickness of the photosensitive etching glass substrate is smaller, the present invention is effective when the thickness of the photosensitive etching glass substrate 30 is in the above-mentioned range. Further, the thermal expansion coefficient C0 of the photosensitive etching glass substrate 30 is 8 to 11 ppm/° C. in this embodiment.

Further, the through hole is formed on the photosensitive etching glass substrate 30, to form the interposer, and the through hole is filled with the conductive substance such as copper, etc. As a method of forming the through hole on the photosensitive etching glass substrate 30 and filling the through hole with the conductive substance, a publicly-known method may be used. For example, the method disclosed in International Publication No. 2005/027605 may be used.

Subsequently, the second substrate 20 is prepared. In this embodiment, the glass substrate is prepared as the substrate for dicing. Since the thermal expansion coefficient C1 of the Si wafer which is the first substrate 10 is 2.6 ppm/° C., the glass substrate having the thermal expansion coefficient C2 of about 1.9 to 3.3 ppm/° C. is used as the glass substrate. Accordingly, in this embodiment, C0 is about three times larger than C1 and C2. Further, the thickness of the second substrate 20 is about 0.3 to 10 mm.

As described above, the photosensitive etching glass substrate 30 and the first substrate 10 are bonded to each other and the photosensitive etching glass substrate 30 and the second substrate 20 are bonded to each other before being cooled. With this structure, the warp is not generated after cooling. Accordingly, if the photosensitive etching glass substrate 30 is interposed between the first substrate 10 and the second substrate 20 before the cooling of the substrates is started, an order of forming the above structure does not matter. Namely, the second substrate 20 may be bonded after thermally bonding the first substrate 10 and the photosensitive etching glass substrate 30 to each other, or the first substrate 10 may be thermally bonded after the photosensitive etching glass substrate 30 and the second substrate 20 are bonded to each other. Explanation will be given hereafter for a case that the first substrate 10 is thermally bonded after the photosensitive etching glass substrate 30 and the second substrate 20 are bonded to each other.

(Bonding Step)

In bonding step S10, the photosensitive etching glass substrate 30 and the second substrate 20 are bonded to each other. The method of bonding the photosensitive etching glass substrate 30 and the second substrate 20 is not particularly limited, and may be bonded to each other by thermal bonding or may be bonded to each other via the adhesive substance. In this embodiment, the second substrate 20 is finally removed from the chip package (the photosensitive etching glass substrate 30 and the first substrate 10), and therefore the photosensitive etching glass substrate 30 and the second substrate 20 are bonded to each other using an adhesive sheet which can be released (for example, thermal release adhesive sheet) for the photosensitive etching glass substrate 30.

Figure 4A:
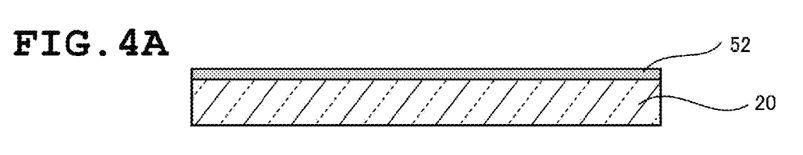
FIG. 4A to FIG. 4E are views showing a manufacturing step of a substrate assembly according to this embodiment.

First, as shown in FIG. 4A, an adhesive sheet 52 is placed on the second substrate 20 at a room temperature, which is then heated to a specific temperature. A heating means may be a means for heating the second substrate 20 from one direction like a hot plate, or may be a means for heating the second substrate 20 from all directions like a heating furnace. In this embodiment, heating is carried out on the hot plate. The temperature for placing the photosensitive etching glass substrate 30 on the second substrate 20 is preferably set to be close to the temperature for thermal bonding (thermal bonding temperature).

Figure 4B:
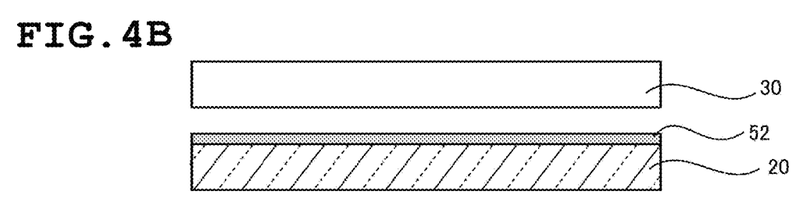

Next, as shown in FIG. 4B, the photosensitive etching glass substrate 30 is placed on the second substrate 20 via the adhesive sheet 52. At this time, the photosensitive etching glass substrate 30 and the second substrate 20 are pressure-bonded to each other by adding pressure thereto as needed.

Figure 4C:
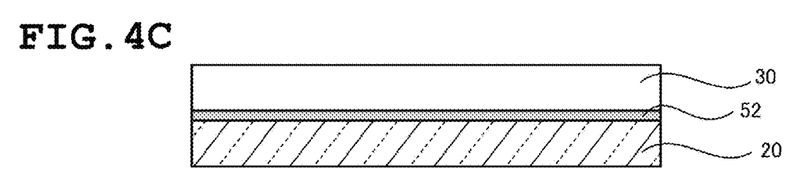

Thus, the photosensitive etching glass substrate 30 and the second substrate 20 are bonded to each other as shown in FIG. 4C. Subsequently, the temperature is raised to the thermal bonding temperature, to thermally bond the photosensitive etching glass substrate 30 and the first substrate 10. At this time, the first substrate 10 and the photosensitive etching glass substrate 30 may be heated in a state that the first substrate 10 is placed on the photosensitive etching glass substrate 30. Further, slow temperature rise may be acceptable.

When the photosensitive etching glass substrate 30 and the second substrate 20 are heated in a bonded state, the stress due to the difference of the thermal expansion coefficients of both substrates is generated. However, since the thermal expansion coefficient of the second substrate 20 is smaller, elongation of the photosensitive etching glass substrate 30 can be rather suppressed. Therefore, even if the photosensitive etching glass substrate 30 and the second substrate 20 are heated in the bonded state, almost no warp is generated.

(Thermal Bonding Step)

In thermal bonding step S20, the photosensitive etching glass substrate 30 and the first substrate 10 are thermally bonded at the thermal bonding temperature. The adhesive substance used for the thermal bonding is not particularly limited, and in this embodiment, solder and ACF, etc., are given for example, to secure electric conduction between the photosensitive etching glass substrate 30 and the first substrate 10. The thermal bonding temperature may be selected according to the adhesive substance used for the thermal bonding and the heat-resistance, etc., of the adhesive substance used for bonding the photosensitive etching glass substrate 30 and the second substrate 20, and in this embodiment, the thermal bonding temperature is preferably set to about 130 to 160° C.

Figure 4D:
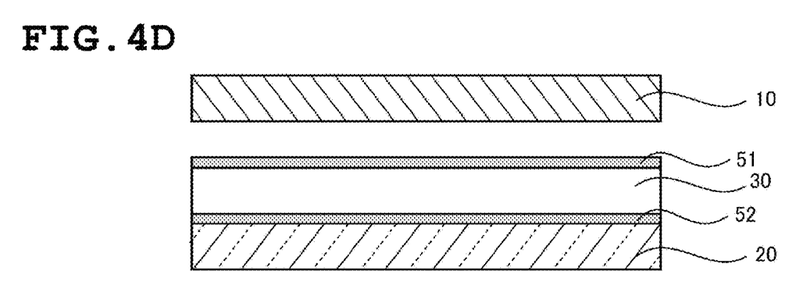

As shown in FIG. 4D, ACF 51 is placed on the photosensitive etching glass substrate 30, and the first substrate 10 is placed on the ACF 51 so that the ACF 51 and the first substrate 10 are pressure-bonded to each other at the thermally bonding temperature. Owing to such a pressure-bonding, conductive particles contained in the ACF are conducted only in a pressure-bonding direction, to secure conduction between the photosensitive etching glass substrate 30 and the first substrate 10 while thermally bonding them.

Figure 4E:
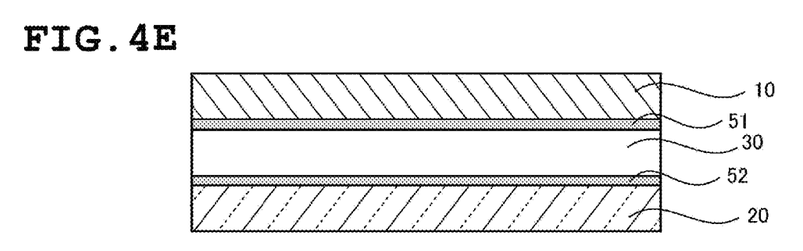

By thermally bonding the photosensitive etching glass substrate 30 and the first substrate 10, the substrate assembly having the structure in which both main surfaces of the photosensitive etching glass substrate 30 are interposed between the first substrate 10 and the second substrate 20 so as to be bonded to each other as shown in FIG. 4E, can be obtained before being cooled. The present invention is characterized in obtaining such a substrate assembly before being cooled.

(Cooling Step)

In cooling step S30, the substrate assembly which is already thermally bonded, is cooled to the room temperature. The stress due to the difference of the thermal expansion coefficients of each substrate is generated when cooling the substrate assembly. However, since the substrate assembly is cooled in a state of a structure shown in FIG. 4E, a deforming direction (warping direction) of the substrate assembly caused by the stress generated between the photosensitive etching glass substrate 30 and the first substrate 10, and a deforming direction (warping direction) of the substrate assembly caused by the stress generated between the photosensitive etching glass substrate 30 and the second substrate 20, are in direct opposition to each other as shown in FIG. 2A and FIG. 2B, and the generated stresses are suppressed inside of the substrate assembly without being allowed to appear as warp. Accordingly, even if the substrate assembly is cooled to the room temperature, warp is not generated in the substrate assembly.

By passing through the above-mentioned step, the wafer level package of the Si wafer (first substrate) and the interposer (photosensitive etching glass substrate) is bonded to the substrate for dicing (second substrate), and the substrate assembly 1 in which the warp is not generated, can be obtained.

3. Method of Manufacturing a Chip Package

Figure 3:
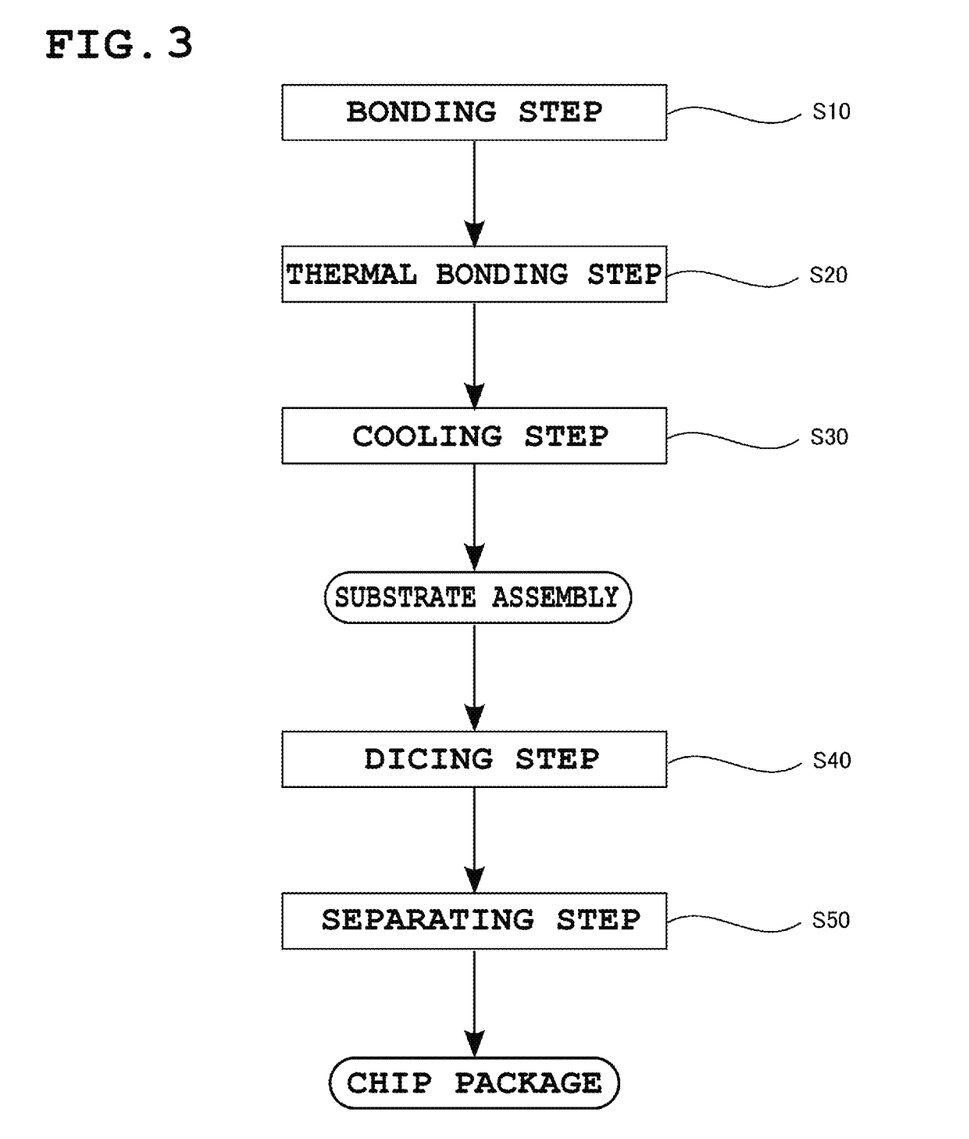
FIG. 3 is a flowchart of a method of manufacturing a substrate assembly according to this embodiment, and a method of manufacturing a chip package according to this embodiment.

Next, explanation is given for the method of manufacturing a chip package according to this embodiment, using a flowchart shown in FIG. 3 and manufacturing steps shown in FIG. 5A to FIG. 5D. The chip package is manufactured hereafter, using the substrate assembly 1 manufactured by the method of manufacturing the substrate assembly 1 described in (2).
(Dicing Step)

Figure 5A:
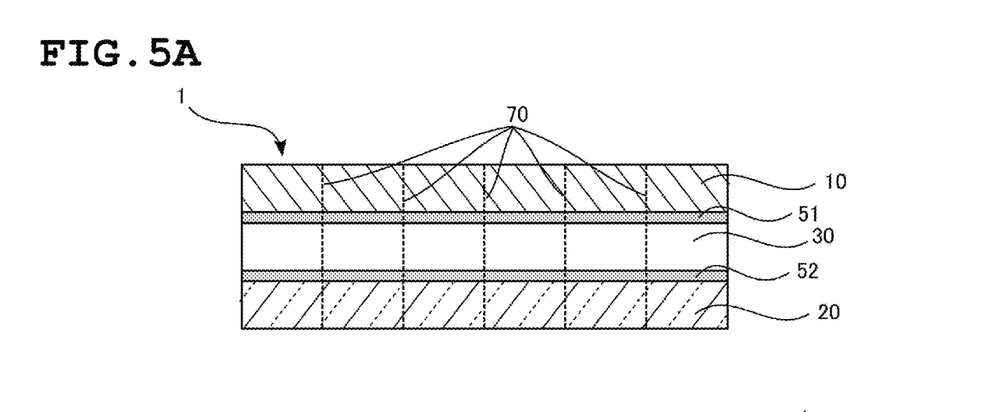
FIG. 5A to FIG. 5D are views showing the manufacturing steps of a chip package according to this embodiment.

In dicing step S40, as shown in FIG. 5A, the substrate assembly 1 of FIG. 1 is divided along a cutting line 70 using a dicing saw not shown, to thereby individually divide the substrate assembly 1 into each semiconductor element unit. A publicly-known cutting blade may be used as the dicing saw, and for example, the substrate assembly 1 may be divided using a diamond blade.

As described above, the stresses are remained inside of the substrate assembly 1. Therefore, when the substrate assembly 1 is divided using the dicing saw after the second substrate 20 is separated from the substrate assembly 1, the stress remained inside of the substrate assembly 1 is released after separating the second substrate 20, and the photosensitive etching glass substrate 30 and the first substrate 10 are warped or damaged. This situation is not preferable.

Figure 5B:
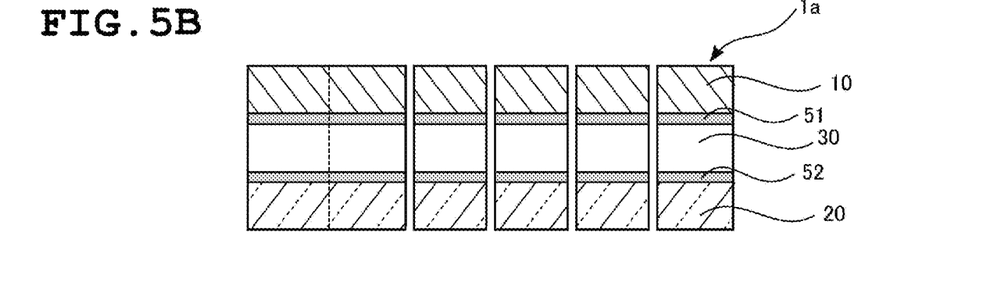
Figure 5C:
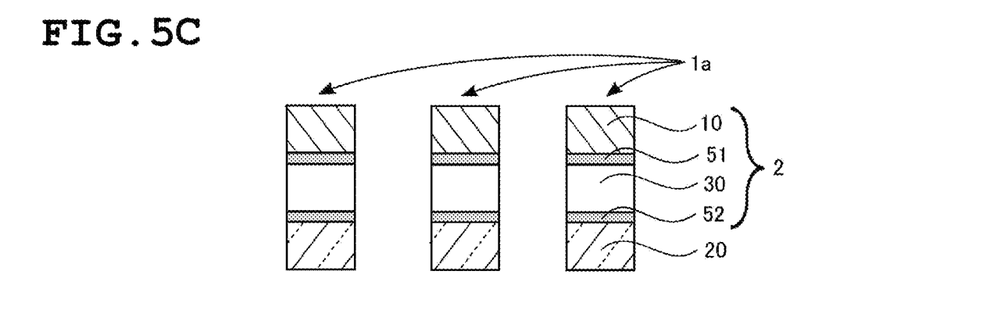

Meanwhile, as shown in FIG. 5B, when a substrate assembly 1a is obtained by dicing and individually dividing the substrate assembly 1 in which the second substrate 20 is bonded, the stress is partially released when dicing the substrate assembly 1. However, the stress is not entirely released, and therefore the stress caused by the substrate assembly 1 exists inside of the individually divided substrate assembly 1a shown in FIG. 5C. However, the stress is an inner stress per unit area, and therefore the stress that exists in the extremely small individually divided substrate assembly 1a is also extremely small compared with the stress that exists in the substrate assembly 1. Accordingly, the stress that exists in the individually divided substrate assembly 1a is not so large as generating the warp in the chip package 2, and therefore the chip package 2 is not warped even if the second substrate 20 is separated in the separating step described later after the substrate assembly 1a is individually divided.
(Separating Step)

Figure 5D:
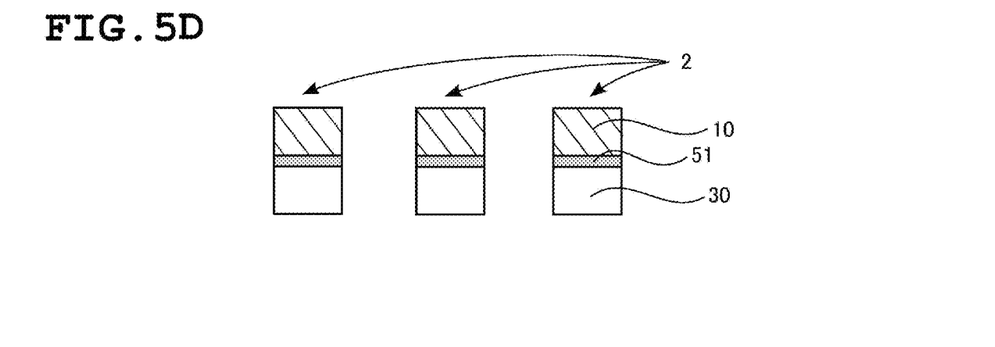

In separating step S50, as shown in FIG. 5D, the second substrate 20 is removed from the individually divided substrate assembly 1a, to thereby obtain the chip package 2. A method of removing the second substrate 20 is not particularly limited, and may be selected according to a substance used for bonding the photosensitive etching glass substrate 30 and the second substrate 20. In this embodiment, the thermal release adhesive sheet as the adhesive sheet 52 is removed, by which the photosensitive etching glass substrate 30 and the second substrate 20 are fixed to each other.

The adhesive sheet 52 has no adhesive force by heating, and therefore the second substrate 20 can be easily separated from the individually divided substrate assembly 1a by heating the individually divided substrate assembly 1a up to a temperature at which the substrate assembly 1a can be separated from the adhesive sheet 52. The chip package 2 (semiconductor element attached with interposer) from which the second substrate 20 is separated, is packaged in the wiring board, etc.

4. Effect of this Embodiment

According to this embodiment, the substrate assembly having a structure shown in FIG. 4E is obtained before being cooled. Since such a structure is completed at a temperature before cooing (for example, 150 to 300° C.), extent of deformation of the substrate assembly caused by the stress generated between the photosensitive etching glass substrate 30 and the first substrate 10, and extent of deformation of the substrate assembly caused by the stress generated between the photosensitive etching glass substrate 30 and the second substrate 20, are about the same, and deforming directions are opposite to each other. As a result, the deformation (warp) of the substrate assembly is almost canceled inside of the substrate assembly, and therefore the substrate assembly 1 is cooled without generating the warp. Accordingly, the warp is not generated in the substrate assembly 1 which is obtained after cooling.

Namely, if the relation of the thermal expansion coefficient of each substrate is set in the above-mentioned range and the structure shown in FIG. 4E is completed by a final stage of a series of high temperature process such as thermal bonding, etc., the effect of the present invention can be obtained.

Particularly, in the substrate assembly 1 in which the photosensitive etching glass substrate 30 is the interposer, the first substrate 10 is the Si wafer, and the second substrate 20 can be separated from the photosensitive etching glass substrate 30 and the first substrate 10, the following effect can be obtained. Namely, the substrate assembly 1 is individually divided by dicing and thereafter the second substrate 20 is separated, to thereby obtain the chip package 2 (semiconductor element and interposer).

At this time, the stress that exists inside of the substrate assembly 1 is partially released little by little by being diced into the chip element units. Although the stress also exists even in the individually divided substrate assembly 1a, the stress in the individually divided substrate assembly 1a is extremely small compared with the stress that exists in the substrate assembly 1. Therefore, the stress caused by the substrate assembly 1 which exists in the individually divided substrate assembly 1a is not so large as generating the warp in the chip package 2. Accordingly, even if the second substrate 20 is separated from the individually divided substrate assembly 1a, the warp is not generated in the chip package 2.

Namely, even if the stress exists inside of the substrate assembly, the stress that exists in the individually divided substrate assembly is the stress not allowing the warp to be generated in the chip package. Accordingly, since the warp is not generated in the chip package, yield of the chip package can be increased, and package in the wiring board, etc., can be easily performed.

5. Modified Example, Etc.

In the above-mentioned embodiment, explanation is given for a case that the photosensitive etching glass substrate 30 constitutes the interposer, the first substrate 10 is the Si wafer, and the second substrate 20 is the substrate for dicing. However, in the present invention, the substrate assembly 1 with warp suppressed can be obtained by setting the thermal expansion coefficient of each substrate in a specific relation, and forming the substrate assembly in a structure shown in FIG. 4E irrespective of a function of each substrate. Accordingly, the material, purpose of use, and presence/absence of processing (such as formation of the through hole, etc.) of each substrate is not limited, and the effect of the present invention can be obtained if the photosensitive etching glass substrate 30, the first substrate 10 and the second substrate 20 are set in a specific relation and have the structure shown in FIG. 4E.

In the above-mentioned embodiment, the thermal expansion coefficient C0 of the photosensitive etching glass substrate is larger than the thermal expansion coefficients (C1, C2) of each of the first substrate and the second substrate. However, C0 may be smaller than C1 and C2. In this case as well, the deformation of the substrate assembly is canceled inside of the substrate assembly, and the above-mentioned effect can be obtained. In this case, when the photosensitive etching glass substrate is brought into contact with the second substrate, warp is easily generated if a heating means for heating from one direction, such as a hot plate, etc., is used. Therefore, a heating means for heating from all directions, such as a heating furnace, etc., is preferably used.

Further, as described in the above-mentioned embodiment, when the photosensitive etching glass and the first substrate are thermally bonded to each other by heating them up to a thermal bonding temperature after the photosensitive etching glass substrate and the second substrate are bonded to each other, to thereby obtain the structure of interposing the photosensitive etching glass between the first substrate and the second substrate and thereafter the substrate assembly thus obtained is cooled, the stress is generated between the photosensitive etching glass substrate and the second substrate on both heating and cooling. Meanwhile, the stress is generated between the photosensitive etching glass substrate and the first substrate when this structure is cooled. That is the stress between the photosensitive etching glass substrate and the second substrate is generated on heating, besides this, also on cooling. Therefore, by setting the thermal expansion coefficient C1 of the substrate slightly smaller than the thermal expansion coefficient C2 of the second substrate, the stress generated between the photosensitive etching glass substrate and the first substrate is larger than the stress generated between the photosensitive etching glass substrate and the second substrate when cooling the substrate assembly, and therefore the deformation of the substrate assembly can be easily canceled.

Specifically, when satisfying C0>C1, C2, C1/C2<1 is preferable, and when satisfying C0<C1, C2, C1/C2>1 is preferable.

In the above-mentioned embodiment, the crystallized photosensitive etching glass is used as the glass base material constituting the photosensitive etching glass substrate. However, a non-crystallized photosensitive etching glass substrate can also be used.

Further, in the above-mentioned embodiment, the second substrate is finally separated from the photosensitive etching glass substrate and the first substrate, and therefore the photosensitive etching glass substrate and the second substrate are bonded to each other using the thermal release adhesive sheet. However, thermoplastic resin may also be used as the adhesive substance, in consideration of the heat-resistance, etc., of the adhesive sheet.

As described above, the embodiment of the present invention is given. However, the present invention is not limited to the above-mentioned embodiment, and can be variously modified in a range not departing from the gist of the invention.

EXAMPLE

The present invention will be described hereafter based on a further detailed example. However, the present invention is not limited thereto.

Example

PEG3C produced by HOYA Corporation, was used as the photosensitive etching glass substrate. PEG3C has a composition of $SiO_2$—$Li_2O$—$Al_2O_3$, and the thermal expansion coefficient C0 was 10.5 ppm/° C. Further, a through hole having a diameter of 10 to 100 μm is formed on the PEG3C corresponding to the wiring pattern of the semiconductor element formed on the Si wafer described later, and the PEG3C is formed as the interposer. The thickness of the PEG3C was 1.0 mm.

The Si wafer having a diameter of 200 mm was used as the first substrate. The semiconductor element having a specific wiring pattern was formed on the Si wafer. The thermal expansion coefficient C1 of the Si wafer was 2.6 ppm/° C.

The glass substrate (TEMPAX Float (registered trademark): produced by SCHOTT JENAer GLAS GmbH) was used as the substrate for dicing. The thickness of the glass substrate was 1.1 mm, and the thermal expansion coefficient C2 was 3.3 ppm/° C.

First, the photosensitive etching glass substrate and the second substrate were bonded to each other. Specifically, the adhesive sheet for dicing (REVALPHA (registered trademark) produced by NITTO DENKO CORPORATION) was placed on the second substrate, which were then heated up to 80° C. on the hot plate. Then, the photosensitive etching glass substrate was placed on the adhesive sheet, which were then pressure-bonded to each other. Namely, the photosensitive etching glass substrate and the second substrate were bonded to each other, via the adhesive sheet.

Subsequently, ACF (CP30941-20AB) produced by Dexerials Corporation) was placed on the photosensitive etching glass substrate, and the first substrate was placed thereon. In this state, the substrate assembly thus obtained was heated up to 160° C. so as to be pressure-bonded and thermally bonded to each other. Namely, the photosensitive etching glass substrate and the first substrate were thermally bonded to each other via ACF. With this structure, the following structure could be obtained in the stage of the thermal bonding: namely, the photosensitive etching glass substrate was interposed between the first substrate and the second substrate so that the photosensitive etching glass substrate and the first substrate were thermally bonded to each other, and the photosensitive etching glass substrate and the second substrate were bonded to each other.

Subsequently, by cooling this structure down to the room temperature, the substrate assembly according to the present invention could be obtained. When the warp of the obtained substrate assembly was measured by a warp measurement device, it was found that the warp was about 0.03 mm, and almost no warp was generated. Namely, although the stress was generated inside of the substrate assembly, an appearance thereof was suppressed, and therefore it can be considered that the warp is not generated in the substrate assembly.

Next, the substrate assembly was diced using a dicing device, and the individually divided substrate assembly was obtained. Further, the individually divided substrate assembly was heated up to 180° C., and the second substrate was separated, to thereby obtain the semiconductor element attached with interposer having a size of about 5 mm square. When the warp of the obtained semiconductor element was measured, it was found that the warp was 0.01 mm or less, and almost no warp was generated.

Namely, it was found that the stress that existed inside of the chip pattern obtained by dicing the substrate assembly, was not so large as generating the warp in the chip package.

What is claimed is:

1. A substrate assembly, comprising:
    a photosensitive etching glass substrate; and
    a first substrate and a second substrate for interposing both main surfaces of the photosensitive etching glass substrate between them,
    wherein the first substrate is a Si wafer,
    the second substrate is a glass substrate,
    one of the main surfaces of the photosensitive etching glass substrate is thermally bonded to the first substrate,
    the other main surface of the photosensitive etching glass substrate is bonded to the second substrate, and
    when a thermal expansion coefficient of the photosensitive etching glass substrate is defined as C0, and a thermal expansion coefficient of the first substrate is defined as C1, and a thermal expansion coefficient of the second substrate is defined as C2, C1/C2 satisfies a relation of 0.7 or more and 1.3 or less, and at least one of a relation of C0/C1 satisfying less than 0.7 or larger than 1.3, and a relation of C0/C2 satisfying less than 0.7 or larger than 1.3 is satisfied.

2. The substrate assembly according to claim 1, wherein a through hole is formed on the photosensitive etching glass substrate, with the through hole filled with a conductive substance, and the photosensitive etching glass substrate constitutes an interposer, and a plurality of chip elements having a specific wiring pattern are formed on the first substrate, so that the interposer and the chip elements are electrically connected to each other.

3. The substrate assembly according to claim 1, wherein the photosensitive etching glass is a crystallized glass.

4. A method of manufacturing the substrate assembly described in claim 1, comprising:
    bonding the photosensitive etching glass substrate and the second substrate; and
    thermally bonding the photosensitive etching glass substrate bonded to the second substrate, and the first substrate at a thermal bonding temperature;
    wherein when a thermal expansion coefficient of the photosensitive etching glass substrate is defined as C0, and a thermal expansion coefficient of the first substrate is defined as C1, and a thermal expansion coefficient of the second substrate is defined as C2, C1/C2 satisfies a relation of 0.7 or more and 1.3 or less, and at least one of a relation of C0/C1 satisfying less than 0.7 or larger than 1.3, and a relation of C0/C2 satisfying less than 0.7 or larger than 1.3 is satisfied.

5. The method of manufacturing a substrate assembly according to claim 4, wherein a through hole is formed on the photosensitive etching glass substrate, with the through hole filled with a conductive substance, and the photosensitive etching glass substrate constitutes an interposer, and a plurality of chip elements having a specific wiring pattern are formed on the first substrate, so that the interposer and the chip elements are electrically connected to each other.

6. The method of manufacturing a substrate assembly according to claim 4, wherein the photosensitive etching glass is a crystallized glass.

7. A method of manufacturing a chip package, comprising:
    dicing and individually dividing a substrate assembly manufactured by the method described in claim 5; and
    separating the second substrate from the individually divided substrate assembly after dicing.

8. The substrate assembly according to claim 2, wherein the photosensitive etching glass is a crystallized glass.

9. The method of manufacturing a substrate assembly according to claim 5, wherein the photosensitive etching glass is a crystallized glass.

10. The substrate assembly according to claim 1, wherein when satisfying C0>C1, C2, a value of C1/C2 is less than 1, or when satisfying C0<C1, C2, a value of C1/C2 is more than 1.

* * * * *